(12) United States Patent
Oh et al.

(10) Patent No.: US 12,068,140 B2
(45) Date of Patent: Aug. 20, 2024

(54) METHOD AND SYSTEM FOR MONITORING SUBSTRATE PROCESSING APPARATUS

(71) Applicant: SAMSUNG ELECTRONICS CO., LTD., Suwon-si (KR)

(72) Inventors: Sejin Oh, Hwaseong-si (KR); Taemin Earmme, Hwaseong-si (KR); Eunwoo Lee, Seongnam-si (KR); Jongwoo Sun, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 475 days.

(21) Appl. No.: 17/372,131

(22) Filed: Jul. 9, 2021

(65) Prior Publication Data

US 2022/0199374 A1 Jun. 23, 2022

(30) Foreign Application Priority Data

Dec. 23, 2020 (KR) ........................ 10-2020-0181885

(51) Int. Cl.
*H01J 37/32* (2006.01)
*H01J 37/244* (2006.01)
(Continued)

(52) U.S. Cl.
CPC ...... *H01J 37/32642* (2013.01); *H01J 37/244* (2013.01); *H01J 37/32183* (2013.01); *H01J 37/32715* (2013.01); *H01L 22/20* (2013.01); *H01J 2237/2007* (2013.01); *H01J 2237/24564* (2013.01); *H01J 2237/334* (2013.01); *H01L 21/6831* (2013.01); *H01L 21/68735* (2013.01)

(58) Field of Classification Search
None
See application file for complete search history.

(56) References Cited

U.S. PATENT DOCUMENTS 5,282,925 A 2/1994 Jeng et al.
9,841,395 B2 12/2017 Sugita et al.
(Continued)

FOREIGN PATENT DOCUMENTS

KR 20080064241 A 7/2008
KR 100874893 B1 12/2008
KR 20200086375 A 7/2020

*Primary Examiner* — Shamim Ahmed
(74) *Attorney, Agent, or Firm* — Fish & Richardson P.C.

(57) ABSTRACT

A method of monitoring a substrate processing apparatus includes applying a high-frequency radio frequency (RF) power signal and a low-frequency RF power signal from a bias power supply apparatus to an electrostatic chuck of a process chamber through a matching circuit. The method further includes applying a direct current (DC) power signal from a DC power supply apparatus to an edge ring of the process chamber through a high-frequency filter and a low-frequency filter. The method further includes measuring a low-frequency RF voltage value at a first point between the matching circuit and the electrostatic chuck, measuring the low-frequency RF voltage value at a second point between the high-frequency filter and the low-frequency filter, and acquiring a voltage ratio between the low-frequency RF voltage value at the first point and the low-frequency RF voltage value at the second point. The method further includes monitoring a state of the edge ring by comparing a threshold with the voltage ratio.

11 Claims, 2 Drawing Sheets

(51) Int. Cl.
  *H01L 21/66* (2006.01)
  *H01L 21/683* (2006.01)
  *H01L 21/687* (2006.01)

(56) References Cited

U.S. PATENT DOCUMENTS

| | | |
|---|---|---|
| 9,875,881 B2 | 1/2018 | Nagami et al. |
| 10,283,330 B2 | 5/2019 | Marakhtanov et al. |
| 10,607,820 B2 | 3/2020 | Yoon et al. |
| 2009/0061542 A1* | 3/2009 | Patrick .................. C23C 16/50 |
| | | 324/71.2 |
| 2014/0231389 A1 | 8/2014 | Nagami et al. |
| 2016/0363556 A1 | 12/2016 | Sugita et al. |
| 2018/0025891 A1 | 1/2018 | Marakhtanov et al. |
| 2018/0090303 A1 | 3/2018 | Yoon et al. |
| 2020/0227326 A1 | 7/2020 | Oikawa et al. |
| 2020/0243308 A1 | 7/2020 | Likhanskii et al. |
| 2020/0335368 A1* | 10/2020 | Pan .................. H01L 21/67259 |
| 2020/0373193 A1 | 11/2020 | Kamp et al. |

\* cited by examiner

METHOD AND SYSTEM FOR MONITORING SUBSTRATE PROCESSING APPARATUS

CROSS-REFERENCE TO THE RELATED APPLICATION

A claim of priority is made to Korean Patent Application No. 10-2020-0181885, filed on Dec. 23, 2020, in the Korean Intellectual Property Office, the disclosure of which is incorporated herein by reference in its entirety.

BACKGROUND

Apparatuses and methods consistent with the inventive concept relate to a method and system for monitoring a substrate processing apparatus.

A semiconductor device is formed via various semiconductor manufacturing processes, example of which include a deposition process, an ion injection process, a photo lithography process, and an etching process. Among these, the etching process may be carried out in a process chamber which includes an edge ring. The edge ring may be damaged by etching together with a wafer as the etching process is performed on the wafer.

SUMMARY

In accordance with an embodiment of the inventive concept, a method of monitoring a substrate processing apparatus includes applying a high-frequency radio frequency (RF) power signal and a low-frequency RF power signal from a bias power supply apparatus to an electrostatic chuck of a process chamber through a matching circuit. The method further includes applying a direct current (DC) power signal from a DC power supply apparatus to an edge ring of the process chamber through a high-frequency filter and a low-frequency filter. The method further includes measuring a low-frequency RF voltage value at a first point between the matching circuit and the electrostatic chuck, measuring the low-frequency RF voltage value at a second point between the high-frequency filter and the low-frequency filter, and acquiring a voltage ratio between the low-frequency RF voltage value at the first point and the low-frequency RF voltage value at the second point. The method further includes monitoring a state of the edge ring by comparing a threshold with the voltage ratio.

In accordance with another embodiment of the inventive concept, a system for monitoring a substrate processing apparatus includes a substrate processing apparatus, a bias power supply apparatus, a matching circuit, a high-frequency filter, a low-frequency filter and a monitoring apparatus. The substrate processing apparatus includes an electrostatic chuck, and an edge ring disposed between opposite sides of the electrostatic chuck and surrounding the electrostatic chuck. The bias power supply apparatus is electrically connected to the electrostatic chuck and is configured to apply a high-frequency RF power signal and a low-frequency RF power signal to the electrostatic chuck. The matching circuit is disposed between the substrate processing apparatus and the bias power supply apparatus and is configured to match an impedance of the substrate processing apparatus and an impedance of the bias power supply apparatus. The high-frequency filter is electrically connected to the edge ring and is configured to filter a high-frequency RF signal among signals flowing from the edge ring. The low-frequency filter electrically is connected to the high-frequency filter and is configured to filter a low-frequency RF signal among signals flowing from the high-frequency filter. The monitoring apparatus is configured to measure a low-frequency RF voltage value at a first point between the electrostatic chuck and the matching circuit and a low-frequency RF voltage value at a second point between the high-frequency filter and the low-frequency filter, and to monitor the edge ring based on the low-frequency RF voltage value at the first point and the low-frequency RF voltage value at the second point.

In accordance with yet another embodiment of the inventive concept, a system for monitoring a substrate processing apparatus includes a substrate processing apparatus, a bias power supply apparatus, a matching circuit, a high-frequency filter, a low-frequency filter, a direct current (DC) power supply apparatus, a first voltage measurement sensor, a second voltage measurement sensor and a monitoring apparatus. The substrate processing apparatus includes an electrostatic chuck, and an edge ring disposed between opposite sides of the electrostatic chuck and surrounding the electrostatic chuck. The bias power supply apparatus is electrically connected to the electrostatic chuck and is configured to apply a high-frequency RF power signal and a low-frequency RF power signal to the electrostatic chuck. The matching circuit is disposed between the substrate processing apparatus and the bias power supply apparatus and is configured to match an impedance of the substrate processing apparatus and an impedance of the bias power supply apparatus. The high-frequency filter is electrically connected to the edge ring and is configured to filter a high-frequency RF signal among signals flowing from the edge ring. The low-frequency filter is electrically connected to the high-frequency filter and is configured to filter a low-frequency RF signal among signals flowing from high-frequency filter. The DC power supply apparatus is electrically connected to the low-frequency filter and is configured to apply a DC power signal to the edge ring. The first voltage measurement sensor is connected to a first point between the electrostatic chuck and the matching circuit and is configured to measure a low-frequency RF voltage value at the first point. The second voltage measurement sensor is connected to a second point between the high-frequency filter and the low-frequency filter and is configured to measure a low-frequency RF voltage value at the second point. The monitoring apparatus is configured to receive the low-frequency RF voltage value at the first point and the low-frequency RF voltage value at the second point from the first voltage measurement sensor and the second voltage measurement sensor, to acquire a voltage ratio between the low-frequency RF voltage value at the first point and the low-frequency RF voltage value at the second point, and to monitor a state of the edge ring by comparing a threshold with the voltage ratio.

DETAILED DESCRIPTION OF EXEMPLARY EMBODIMENTS

Figure 1:
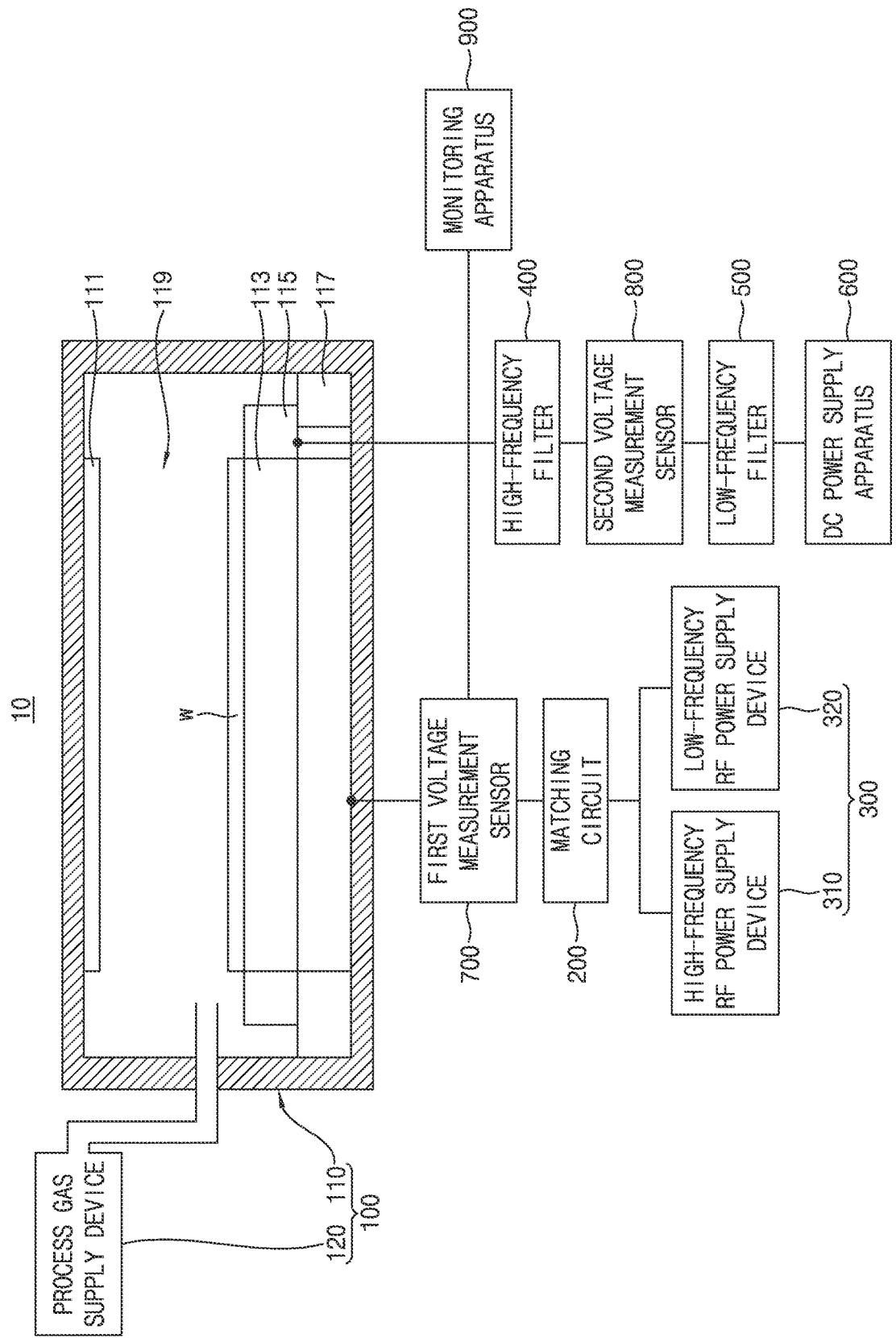
FIG. 1 is a diagram of a substrate processing apparatus monitoring system according to an embodiment of the inventive concept.

FIG. 1 is a diagram of a substrate processing apparatus monitoring system according to an embodiment of the inventive concept.

Referring to FIG. 1, a substrate processing apparatus monitoring system 10 may include a substrate processing apparatus 100, a matching circuit 200, a bias power supply apparatus 300, a high-frequency filter 400, a low-frequency filter 500, a direct current (DC) power supply apparatus 600, a first voltage measurement sensor 700, a second voltage measurement sensor 800, and a monitoring apparatus 900.

The substrate processing apparatus 100 may be electrically connected to the bias power supply apparatus 300 through the matching circuit 200 and may be electrically connected to the DC power supply apparatus 600 through the high-frequency filter 400 and the low-frequency filter 500. The substrate processing apparatus 100 may include a process chamber 110 and a process gas supply device 120.

The process chamber 110 may include an upper electrode 111, an electrostatic chuck 113, an edge ring 115, a coupling 117, and a process region 119.

The upper electrode 111 may be disposed in an upper portion of the process chamber 110. A source radio frequency (RF) power signal may be applied to the upper electrode 111 from a source RF power supply apparatus (not shown). For example, the upper electrode 111 may include a metallic material. For example, the upper electrode 111 may include metallic material such as aluminium (Al), Al alloy, steel, stainless steel, nickel (Ni), or Ni alloy (Inconel®, Hastelloy®, or the like) or a dielectric of ceramic such as quartz ($SiO_2$), SiC, SiN, $Al_2O_3$, AlN, or $Y_2O_3$.

An electrostatic chuck 113 may be disposed in a lower portion of the process chamber 110. The electrostatic chuck 113 may be connected to the bias power supply apparatus 300 through the matching circuit 200. The electrostatic chuck 113 may support a substrate W. The electrostatic chuck 113 may function as a lower electrode in the substrate processing apparatus 100. A bias power signal may be applied to the electrostatic chuck 113 from the bias power supply apparatus 300. The bias power signal may include a high-frequency RF power signal and a low-frequency RF power signal. For example, the electrostatic chuck 113 may include a metallic material.

The edge ring 115 may be disposed at opposite sides of the electrostatic chuck 113. The edge ring 115 may surround the electrostatic chuck 113. The edge ring 115 may be electrically connected to the DC power supply apparatus 600 through the high-frequency filter 400 and the low-frequency filter 500. The edge ring 115 may receive direct current (DC) power from the DC power supply apparatus 600. The edge ring 115 may protect the electrostatic chuck 113 by preventing the same from being damaged by plasma as a process is performed. For example, the edge ring 115 may include silicon carbide and a metallic material. The coupling 117 may be disposed below the edge ring 115. The coupling 117 may surround the electrostatic chuck 113 and the edge ring 115. For example, the coupling 117 may include quartz ($SiO_2$).

The process region 119 may be a space between the upper electrode 111 and the electrostatic chuck 113. The process region 119 may be connected to the process gas supply device 120 and may receive process gas from the process gas supply device 120. The process gas may be used to perform an etching process on the substrate W, and may include, for example, activated gas, inert gas, Cl, $H_2$, and $O_2$. The activated gas may include F, $NF_3$, $C_2F_6$, $CF_4$, COS, $SF_6$, $Cl_2$, $BCl_3$, $C_2HF_5$, and $N_2$, and the inert gas may include Ar and He.

A source RF power signal and a bias power signal may be applied to the process region 119 from the upper electrode 111 and the electrostatic chuck 113. In the process region 119, the source RF power signal and the bias power signal may be capacitively or inductively coupled to process gas, and thus plasma may be generated. In the process region 119, the etching process may be performed on the substrate W using plasma.

Direct current (DC) power may be applied to the process region 119 from the edge ring 115. DC power may restrict plasma to a portion of the process region 119, in which the substrate W is processed, and may prevent the edge ring 115 from being etched by plasma.

The matching circuit 200 may be disposed between the substrate processing apparatus 100 and the bias power supply apparatus 300. The matching circuit 200 may be electrically connected to the electrostatic chuck 113 and the bias power supply apparatus 300.

The matching circuit 200 may match an impedance of the substrate processing apparatus 100 and an impedance of the bias power supply apparatus 300. For example, the matching circuit 200 may include a plurality of variable capacitors that are connected in parallel to each other. In the substrate processing apparatus 100, when the etching process is performed, the state of plasma may be changed in real time, and accordingly the impedance of the substrate processing apparatus 100 may also vary in real time. The matching circuit 200 may match the impedance of the substrate processing apparatus 100 and the impedance of the bias power supply apparatus 300 by continuously adjusting the variable capacitor according to the impedance of the substrate processing apparatus 100, which varies in real time.

The bias power supply apparatus 300 may be electrically connected to the matching circuit 200. The bias power supply apparatus 300 may include a high-frequency RF power supply device 310 and a low-frequency RF power supply device 320.

The high-frequency RF power supply device 310 may generate a high-frequency RF power signal. For example, the high-frequency RF power signal may have a frequency of 35 MHz to 65 MHz. According to an embodiment, the high-frequency RF power signal may have a frequency of 40 MHz. The high-frequency RF power supply device 310 may apply a high-frequency RF power signal to the electrostatic chuck 113 through the matching circuit 200.

The low-frequency RF power supply device 320 may generate a low-frequency RF power signal. For example, the low-frequency RF power signal may have a frequency of 100 KHz to 1 MHz. According to an embodiment, the low-frequency RF power signal may have a frequency of 400 KHz. The low-frequency RF power supply device 320 may apply a low-frequency RF power signal to the electrostatic chuck 113 through the matching circuit 200.

The high-frequency filter 400 may be disposed between the substrate processing apparatus 100 and the low-frequency filter 500. The high-frequency filter 400 may be electrically connected to the edge ring 115 and the low-frequency filter 500. An RF signal may flow to the high-frequency filter 400 from the edge ring 115. The RF signal flowing from the edge ring 115 may include a high-frequency RF signal and a low-frequency RF signal. The high-frequency RF signal and the low-frequency RF signal may correspond to the high-frequency RF power signal and the low-frequency RF power signal, respectively. For example, the high-frequency RF signal and the high-frequency RF power signal may have the same frequency, and the low-frequency RF signal and the low-frequency RF power signal may have the same frequency. The high-frequency filter 400 may filter the high-frequency RF signal among signals flowing from the edge ring 115.

The low-frequency filter 500 may be disposed between the high-frequency filter 400 and the DC power supply apparatus 600. The low-frequency filter 500 may be electrically connected to the high-frequency filter 400 and the DC power supply apparatus 600. An RF signal may flow to the low-frequency filter 500 from the high-frequency filter 400. The RF signal flowing from the high-frequency filter 400 may be a signal obtained by filtering the high-frequency RF signal among RF signals flowing to the high-frequency filter 400 from the edge ring 115. The low-frequency filter 500 may filter a low-frequency RF signal among RF signals flowing from the high-frequency filter 400.

The DC power supply apparatus 600 may be electrically connected to the low-frequency filter 500. The DC power supply apparatus 600 may apply a DC power signal to the edge ring 115 through the low-frequency filter 500 and the high-frequency filter 400. Although not shown in the drawing, according to an embodiment, a parasitic capacitor may be generated between the bias power supply apparatus 300 and the DC power supply apparatus 600. The bias power supply apparatus 300 and the DC power supply apparatus 600 may be electrically connected to each other through the parasitic capacitor, and a bias power signal may be applied to the edge ring 115 through the low-frequency filter 500 and the high-frequency filter 400.

The first voltage measurement sensor 700 may be disposed at a first point that is between the substrate processing apparatus 100 and the matching circuit 200. For example, the first point may be a terminal part of the electrostatic chuck 113 or a terminal part of the matching circuit 200. The first voltage measurement sensor 700 may be electrically connected to the monitoring apparatus 900. The first voltage measurement sensor 700 may measure low-frequency RF voltage at the first point. The low-frequency RF voltage may be a voltage corresponding to a low-frequency RF power signal. The low-frequency RF voltage may be a peak to peak voltage or a root mean square (RMS) voltage. The first voltage measurement sensor 700 may transmit a measured value of the low-frequency RF voltage to the monitoring apparatus 900.

The second voltage measurement sensor 800 may be disposed at a second point that is between the high-frequency filter 400 and the low-frequency filter 500. For example, the second point may be a terminal part of the high-frequency filter 400 or a terminal part of the low-frequency filter 500. Although FIG. 1 illustrates the case in which the second point is between the high-frequency filter 400 and the low-frequency filter 500, the second point may be between the edge ring 115 and the high-frequency filter 400. In this case, the second point may be a terminal part of the edge ring 115 or a terminal part of the high-frequency filter 400. The second voltage measurement sensor 800 may be electrically connected to the monitoring apparatus 900. The second voltage measurement sensor 800 may measure low-frequency RF voltage at the second point. The second voltage measurement sensor 800 may transmit a measured value of the low-frequency RF voltage at the second point to the monitoring apparatus 900.

The monitoring apparatus 900 may receive the measured value of the low-frequency RF voltage at the first point and the measured value of the low-frequency RF voltage at the second point from the first voltage measurement sensor 700 and the second voltage measurement sensor 800. Although FIG. 1 illustrates the case in which the substrate processing apparatus monitoring system 10 includes the first voltage measurement sensor 700 and the second voltage measurement sensor 800 that are separately configured, the first voltage measurement sensor 700 and the second voltage measurement sensor 800 may be omitted, and the monitoring apparatus 900 may measure the low-frequency RF voltage at the first point and the low-frequency RF voltage at the second point. The monitoring apparatus 900 may monitor whether abnormality occurs in the substrate processing apparatus 100 based on the low-frequency RF voltage value at the first point and the low-frequency RF voltage value at the second point and may extract an etching amount of the edge ring 115.

Figure 2:
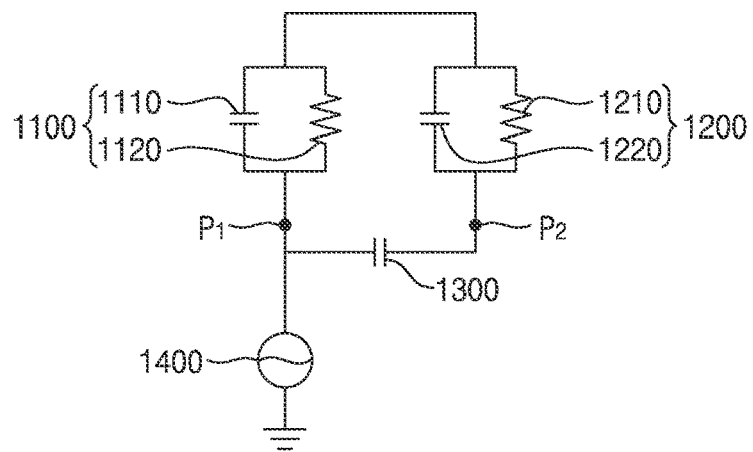
FIG. 2 is an equivalent circuit diagram obtained by modeling a substrate processing apparatus monitoring system according to an embodiment of the inventive concept.

FIG. 2 is an equivalent circuit diagram obtained by modeling a substrate processing apparatus monitoring system according to an embodiment of the inventive concept.

Referring to FIG. 2, a substrate processing apparatus monitoring system 20 may include the equivalent circuits of an electrostatic chuck 1100, an edge ring 1200, a parasitic capacitor 1300, and a low-frequency power supply apparatus 1400. The substrate processing apparatus monitoring system 20 may be the same as the substrate processing apparatus monitoring system 10 of FIG. 1, but with some components omitted for convenience of description.

The equivalent circuit of the electrostatic chuck 1100 may include a first capacitor 1110 and a first resistor 1120 connected parallel to the first capacitor 1110. Although FIG. 2 illustrates the case in which the equivalent circuit of the electrostatic chuck 1100 includes only the first capacitor 1110 and the first resistor 1120, this is merely an example and the inventive concept is not limited thereto. The electrostatic chuck 1100 may receive a low-frequency RF power signal from the low-frequency power supply apparatus 1400.

The equivalent circuit of the edge ring 1200 may include a second capacitor 1210 and a second resistor 1220 connected parallel to the second capacitor 1210. The edge ring 1200 may receive a low-frequency RF power signal from the low-frequency power supply apparatus 1400 through the parasitic capacitor 1300. The parasitic capacitor 1300 may be generated between a first point $P_1$ and a second point $P_2$. When the etching process is performed on the substrate W in the process region 119, the edge ring 1200 may be etched by plasma. In this case, the thickness of the edge ring 1200 may be reduced, and thus the impedance of the edge ring 1200 may be reduced. Thus, the amplitude of the low-frequency RF voltage value measured at the second point $P_2$ may be reduced.

Figure 3:
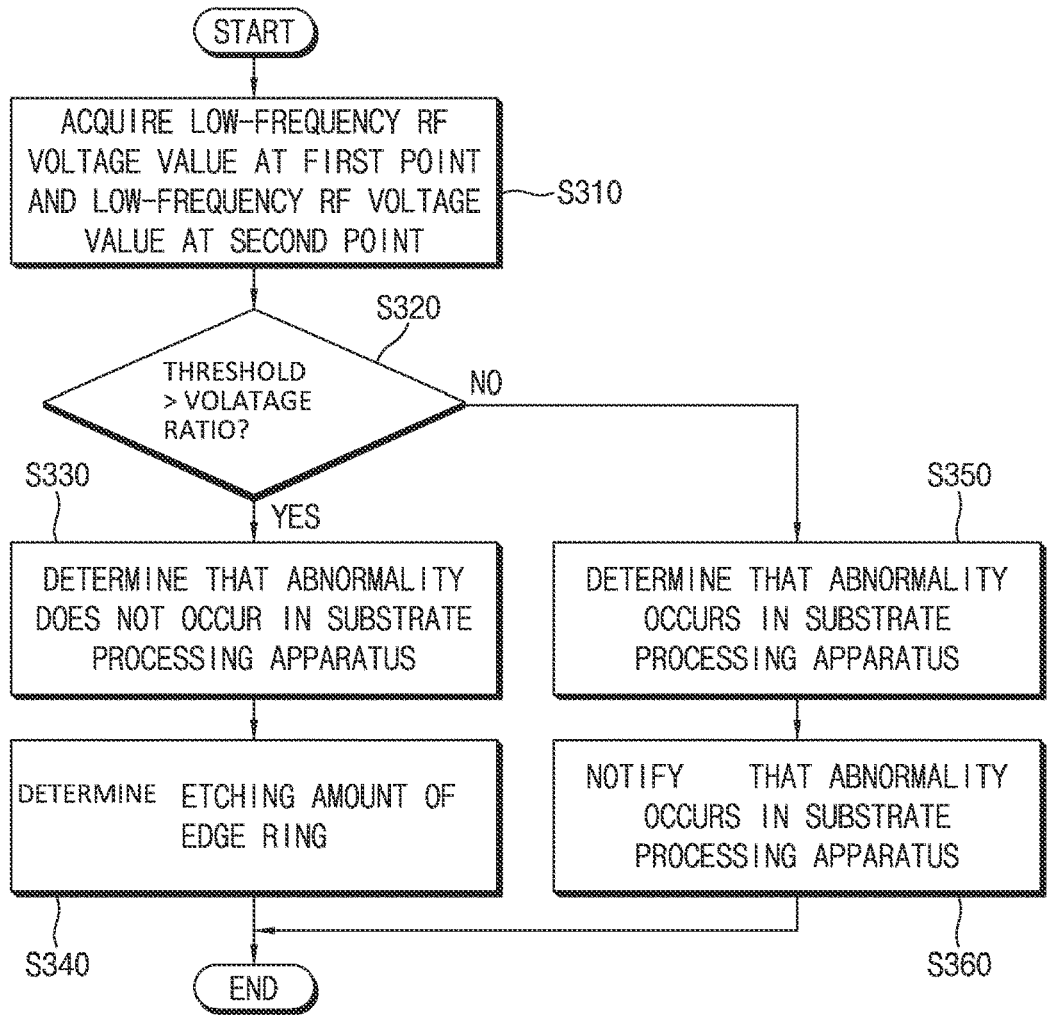
FIG. 3 is a flowchart of a method of monitoring a substrate processing apparatus according to an embodiment of the inventive concept.

FIG. 3 is a flowchart of a method of monitoring a substrate processing apparatus according to an embodiment of the inventive concept.

Referring to FIGS. 1 and 3, the monitoring apparatus 900 may acquire a low-frequency RF voltage value at a first point and a low-frequency RF voltage value at a second point (S310). The monitoring apparatus 900 may receive the low-frequency RF voltage value at the first point through the first voltage measurement sensor 700 and may receive the low-frequency RF voltage value at the second point through the second voltage measurement sensor 800. When the first voltage measurement sensor 700 and the second voltage measurement sensor 800 are omitted, the monitoring apparatus 900 may measure the low-frequency RF voltage value at the first point and the low-frequency RF voltage value at the second point.

The monitoring apparatus 900 may determine whether a threshold is greater than a voltage ratio (S320). The voltage ratio may be a ratio between the low-frequency RF voltage value at the first point and the low-frequency RF voltage value at the second point. In the present example embodiment, the voltage ratio value may be obtained by dividing the low-frequency RF voltage value at the second point by the low-frequency RF voltage value at the first point. The threshold may be a value determined through an experiment and may be, for example, 0.9 to 1.1.

When the threshold is greater than the voltage ratio (YES of S320), the monitoring apparatus 900 may determine that an abnormality does not occur in the substrate processing apparatus 100 (S330). When determining that an abnormality does not occur in the substrate processing apparatus 100, the monitoring apparatus 900 may determine the etching amount of the edge ring 115 from the voltage ratio and may terminate monitoring (S340). For example, the etching amount may be proportional to the voltage ratio.

When the threshold is equal to or less than the voltage ratio (NO of S320), the monitoring apparatus 900 may determine that an abnormality occurs in the substrate processing apparatus 100 (S350). For example, when the threshold is equal to or less than the voltage ratio, the monitoring apparatus 900 may determine that abnormality occurs in the assembly of the edge ring 115. When a difference between the threshold and the voltage ratio is equal to or greater than a preset value, it may be determined that abnormality occurs in an assembly pin of the edge ring 115, and when the difference is less than a preset value, it may be determined that abnormality occurs in coupling between the edge ring 115 and the DC power supply apparatus 600.

When an abnormality is deemed to have occurred in the substrate processing apparatus 100, the monitoring apparatus 900 may notify the substrate processing apparatus 100 about the occurrence of the abnormality and may terminate monitoring (S360).

According to an embodiment of the inventive concept, the state of an edge ring may be monitored based on a voltage ratio without a separate measurement device, and accordingly a process chamber may be easily mass-produced.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A method of monitoring a substrate processing apparatus, the method comprising:

applying a high-frequency radio frequency (RF) power signal and a low-frequency RF power signal from a bias power supply apparatus to an electrostatic chuck of a process chamber through a matching circuit;

applying a direct current (DC) power signal from a DC power supply apparatus to an edge ring of the process chamber through a high-frequency filter and a low-frequency filter;

measuring a low-frequency RF voltage value at a first point between the matching circuit and the electrostatic chuck;

measuring the low-frequency RF voltage value at a second point between the high-frequency filter and the low-frequency filter;

acquiring a voltage ratio between the low-frequency RF voltage value at the first point and the low-frequency RF voltage value at the second point; and monitoring a state of the edge ring by comparing a threshold with the voltage ratio.

2. The method of claim 1, wherein the high-frequency RF power signal has a frequency of 35 MHz to 65 MHz.

3. The method of claim 1, wherein the low-frequency RF power signal has a frequency of 100 KHz to 1 MHz.

4. The method of claim 1, wherein the first point is a terminal part of the matching circuit or a terminal part of the electrostatic chuck.

5. The method of claim 1, wherein the second point is a terminal part of the high-frequency filter or a terminal part of the low-frequency filter.

6. The method of claim 1, wherein the low-frequency RF voltage value is a peak to peak voltage or a root mean square (RMS) voltage value.

7. The method of claim 1, wherein the voltage ratio is obtained by dividing the low-frequency RF voltage value at the second point by the low-frequency RF voltage value at the first point, and the monitoring the state of the edge ring by comparing the threshold with the voltage ratio comprises determining whether the threshold is greater than the voltage ratio.

8. The method of claim 7, further comprising, when the threshold is greater than the voltage ratio, determining that an abnormality does not occur in the substrate processing apparatus and extracting an etching amount of the edge ring.

9. The method of claim 8, wherein the etching amount is proportional to the voltage ratio.

10. The method of claim 7, further comprising, when the threshold is equal to or less than the voltage ratio, determining that an abnormality occurs in the substrate processing apparatus and notifying the substrate processing apparatus about occurrence of the abnormality.

11. The method of claim 1, wherein the threshold is 0.9 to 1.1.

* * * * *